US009391041B2

(12) United States Patent
Lin

(10) Patent No.: US 9,391,041 B2
(45) Date of Patent: Jul. 12, 2016

(54) FAN-OUT WAFER LEVEL PACKAGE STRUCTURE

(71) Applicant: Taiwan Semiconductor Manufacturing Company, Ltd., Hsin-Chu (TW)

(72) Inventor: Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/656,053

(22) Filed: Oct. 19, 2012

(65) Prior Publication Data

US 2014/0110856 A1    Apr. 24, 2014

(51) Int. Cl.
*H01L 21/00*    (2006.01)
*H01L 23/00*    (2006.01)
(Continued)

(52) U.S. Cl.
CPC .......... *H01L 24/19* (2013.01); *H01L 23/49822* (2013.01); *H01L 23/49827* (2013.01); *H01L 23/49833* (2013.01); *H01L 23/5389* (2013.01); *H01L 24/20* (2013.01); *H01L 25/105* (2013.01); *H01L 23/49816* (2013.01); *H01L 25/03* (2013.01); *H01L 2224/12105* (2013.01); *H01L 2224/16145* (2013.01); *H01L 2224/16146* (2013.01); *H01L 2224/16225* (2013.01); *H01L 2224/73259* (2013.01); *H01L 2224/9222* (2013.01); *H01L 2225/1035* (2013.01); *H01L 2225/1058* (2013.01); *H01L 2924/181* (2013.01); *H01L 2924/18162* (2013.01)

(58) Field of Classification Search
USPC .......................................... 257/774; 438/127
See application file for complete search history.

(56) References Cited

U.S. PATENT DOCUMENTS 6,281,046 B1    8/2001  Lam
6,335,565 B1    1/2002  Miyamoto et al.
(Continued)

FOREIGN PATENT DOCUMENTS

CN    101315924        12/2008
CN    102034718 A      4/2011
(Continued)

OTHER PUBLICATIONS

Chen et al., "POP Structures and Methods of Forming the Same," U.S. Appl. No. 14/618,446, Taiwan Semiconductor Manufacturing Company, Ltd., filed Feb. 10, 2015, 32 pages.
(Continued)

*Primary Examiner* — Marc Armand
*Assistant Examiner* — Wilner Jean Baptiste
(74) *Attorney, Agent, or Firm* — Slater Matsil, LLP

(57) ABSTRACT

A method for forming a package structure may comprise applying a die and vias on a carrier having an adhesive layer and forming a molded substrate over the carrier and around the vias, and the ends of the vias and mounts on the die exposed. The vias may be in via chips with one or more dielectric layers separating the vias. The via chips 104 may be formed separately from the carrier. The dielectric layer of the via chips may separate the vias from, and comprise a material different than, the molded substrate. An RDL having RDL contact pads and conductive lines may be formed on the molded substrate. A second structure having at least one die may be mounted on the opposite side of the molded substrate, the die on the second structure in electrical communication with at least one RDL contact pad.

19 Claims, 5 Drawing Sheets

(51) Int. Cl.
*H01L 23/538* (2006.01)
*H01L 25/10* (2006.01)
H01L 23/498 (2006.01)
H01L 25/03 (2006.01)

(56) References Cited

U.S. PATENT DOCUMENTS

| | | |
|---|---|---|
| 7,105,920 B2 | 9/2006 | Su et al. |
| 7,573,136 B2 | 8/2009 | Jiang et al. |
| 8,093,722 B2 | 1/2012 | Chen et al. |
| 8,105,875 B1 | 1/2012 | Hu et al. |
| 8,263,439 B2 | 9/2012 | Marimuthu et al. |
| 8,293,580 B2 | 10/2012 | Kim et al. |
| 8,361,842 B2 * | 1/2013 | Yu .................. H01L 21/561 257/E21.499 |
| 8,435,835 B2 | 5/2013 | Pagaila et al. |
| 8,476,769 B2 | 7/2013 | Chen et al. |
| 8,503,186 B2 | 8/2013 | Lin et al. |
| 8,508,045 B2 | 8/2013 | Khan et al. |
| 8,710,657 B2 | 4/2014 | Park et al. |
| 8,736,035 B2 | 5/2014 | Hwang et al. |
| 8,754,514 B2 | 6/2014 | Yu et al. |
| 8,928,114 B2 | 1/2015 | Chen et al. |
| 8,957,525 B2 | 2/2015 | Lyne et al. |
| 8,975,726 B2 | 3/2015 | Chen et al. |
| 9,048,306 B2 | 6/2015 | Chi et al. |
| 9,087,835 B2 | 7/2015 | Sutardja et al. |
| 2002/0117743 A1 | 8/2002 | Nakatani et al. |
| 2004/0187297 A1 | 9/2004 | Su et al. |
| 2004/0256731 A1 | 12/2004 | Mao et al. |
| 2006/0043549 A1 * | 3/2006 | Hsu ............................. 257/678 |
| 2006/0133056 A1 | 6/2006 | Wyrzykowska et al. |
| 2007/0161266 A1 | 7/2007 | Nishizawa |
| 2008/0006936 A1 | 1/2008 | Hsu |
| 2008/0142976 A1 | 6/2008 | Kawano |
| 2008/0220563 A1 | 9/2008 | Karnezos |
| 2008/0277800 A1 | 11/2008 | Hwang et al. |
| 2009/0057862 A1 | 3/2009 | Ha et al. |
| 2009/0155957 A1 | 6/2009 | Chen et al. |
| 2009/0230535 A1 | 9/2009 | Otremba et al. |
| 2010/0112756 A1 * | 5/2010 | Amrine et al. ................ 438/113 |
| 2010/0127345 A1 | 5/2010 | Sanders et al. |
| 2010/0133704 A1 * | 6/2010 | Marimuthu et al. ......... 257/778 |
| 2010/0140779 A1 | 6/2010 | Lin et al. |
| 2010/0155922 A1 | 6/2010 | Pagaila et al. |
| 2010/0237482 A1 | 9/2010 | Yang et al. |
| 2011/0024916 A1 | 2/2011 | Marimuthu et al. |
| 2011/0037157 A1 | 2/2011 | Shin et al. |
| 2011/0062592 A1 | 3/2011 | Lee et al. |
| 2011/0090570 A1 | 4/2011 | DeCusatis et al. |
| 2011/0156247 A1 | 6/2011 | Chen et al. |
| 2011/0163391 A1 | 7/2011 | Kinzer et al. |
| 2011/0186960 A1 | 8/2011 | Wu et al. |
| 2011/0215464 A1 | 9/2011 | Guzek et al. |
| 2011/0241218 A1 * | 10/2011 | Meyer et al. ................... 257/774 |
| 2011/0260336 A1 | 10/2011 | Kang et al. |
| 2012/0032340 A1 * | 2/2012 | Choi et al. ..................... 257/774 |
| 2012/0038053 A1 | 2/2012 | Oh et al. |
| 2012/0139068 A1 | 6/2012 | Stacey |
| 2012/0161315 A1 | 6/2012 | Lin et al. |
| 2012/0208319 A1 | 8/2012 | Meyer et al. |
| 2012/0273960 A1 | 11/2012 | Park et al. |
| 2012/0319294 A1 | 12/2012 | Lee et al. |
| 2012/0319295 A1 | 12/2012 | Chi et al. |
| 2013/0009322 A1 | 1/2013 | Conn et al. |
| 2013/0009325 A1 | 1/2013 | Mori et al. |
| 2013/0062760 A1 * | 3/2013 | Hung et al. ................... 257/738 |
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0181325 A1 | 7/2013 | Chen et al. |
| 2013/0182402 A1 | 7/2013 | Chen et al. |
| 2013/0256836 A1 | 10/2013 | Hsiao et al. |
| 2013/0334697 A1 | 12/2013 | Shin et al. |
| 2014/0070422 A1 | 3/2014 | Hsiao et al. |
| 2014/0103488 A1 * | 4/2014 | Chen et al. .................... 257/532 |
| 2014/0264836 A1 | 9/2014 | Chun et al. |
| 2015/0093881 A1 | 4/2015 | Chen et al. |
| 2015/0115464 A1 | 4/2015 | Yu et al. |
| 2015/0115470 A1 | 4/2015 | Su et al. |

FOREIGN PATENT DOCUMENTS

| | | |
|---|---|---|
| KR | 101099578 B1 | 12/2011 |
| KR | 1020120094182 | 8/2012 |
| KR | 1020120075855 | 9/2012 |
| KR | 1020120098844 | 9/2012 |
| TW | 200919632 A | 5/2009 |
| WO | 2011090570 | 7/2011 |

OTHER PUBLICATIONS

Zhang, Y. et al., "Lead-Free Bumping and Its Challenges," IWPLC Conference Proceedings, Oct. 10, 2004, 8 pages.
Cheah, Bok Eng, et al., "A Novel Inter-Package Connection for Advanced Package-on-Package Enabling," IEEE Electronic Components and Technology Conference, May 31-Jun. 3, 2011, pp. 589-594.

* cited by examiner

FAN-OUT WAFER LEVEL PACKAGE STRUCTURE

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between chips, and subsequent interconnect distance.

One method used to reduce the distance between various chips forming a system is to stack chips, with electrical interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces.

Additionally, a package-on-package structure may be mounted on another carrier, package, PCB, or the like, via a solder ball grid array (BGA), land grid array (LGA), or the like. In some instances, the separation of the individual interconnections in an array, or bond pitch, may not match the die within the package-on-page structure, or may require a different connection arrangement than within the package-on-package structure.

BRIEF DESCRIPTION OF THE DRAWINGS

For a more complete understanding of the present embodiments, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale. For clarity non-essential reference numbers are left out of individual figures where possible.

DETAILED DESCRIPTION OF ILLUSTRATIVE EMBODIMENTS

The making and using of the embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using fan-out structures useful in, for example, wafer level package assemblies. Other embodiments may also be applied, however, to other electrical components, including, but not limited to, mounting memory assemblies, displays, input assemblies, discrete components, power supplies or regulators or any other components.

Figure 10:
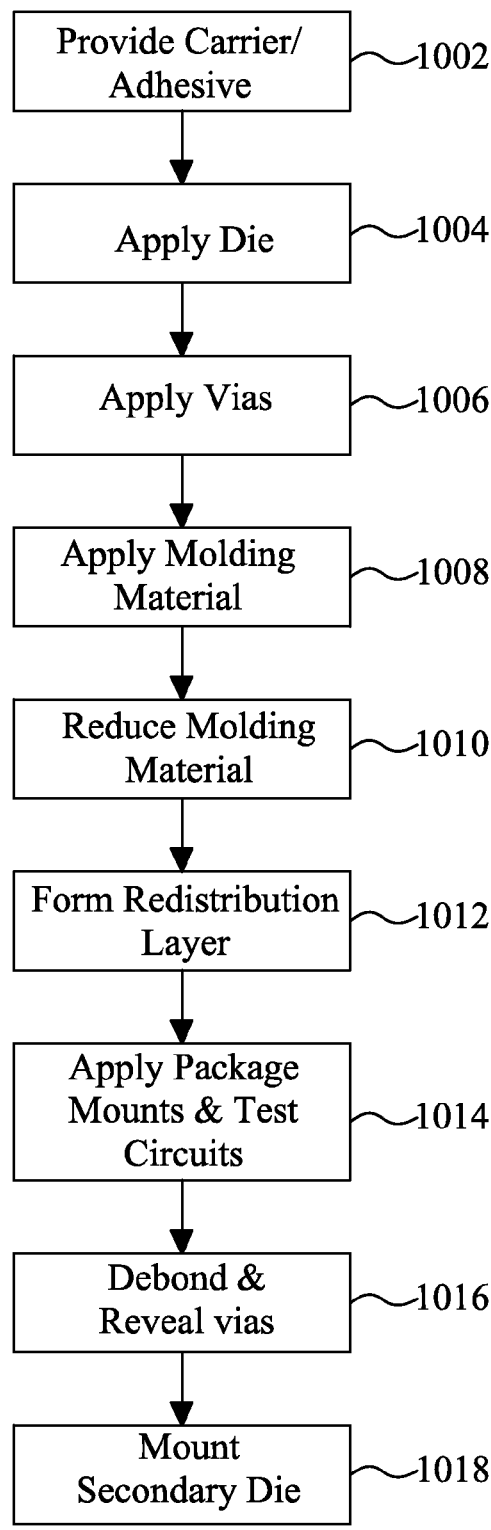
FIG. 10 is a flow diagram illustrating steps in an embodiment of a method for fabricating a fan-out wafer level package structure according to an embodiment of the disclosure.

FIG. 10 is a flow diagram illustrating steps in an embodiment of a method 1000 for fabricating a fan-out wafer level package structure. FIG. 10 is described in conjunction with FIGS. 1-7, which illustrate intermediate steps in the method 1000 for forming the fan-out wafer level packaging structure.

Figure 1:
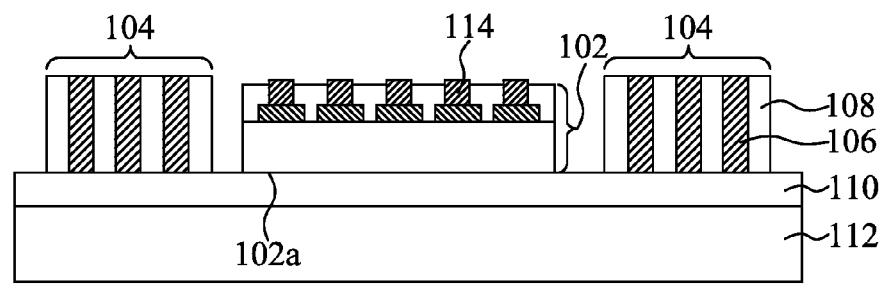
FIGS. 1-7 are cross-sectional diagrams illustrating intermediate steps in a method for fabricating a fan-out wafer level package structure according to an embodiment of the disclosure.

Initially referring to FIG. 10, a first step in an embodiment of a method 1000 for fabricating a fan-out wafer level package is shown in block 1002. A carrier 112 and optionally, an adhesive layer 110, may be provided as shown in FIG. 1. The carrier 112 may be configured to provide structural rigidity or a base for deposition of subsequent non-rigid layers. In one embodiment, the carrier 112 may be glass, but may alternatively be a wafer, semiconductor, metal, synthetic or other material having a suitable topography and structural rigidity.

The adhesive layer 110 may, in some embodiments, may be applied to the carrier 112. In one embodiment, the adhesive layer 110 may be adhesive tape or die attachment film (DAF), or alternatively, may be a glue or epoxy applied to the carrier 112 via a spin-on process, or the like. In some embodiments, the adhesive layer 110 may be used to separate the carrier 112 from the fan-out assembly (See FIG. 8, element 800) and associated devices or layers in subsequent steps.

A die 102 may be applied in block 1004, and as shown in FIG. 1. The application of the die 102 is not limited to application of a single die 102, as the presented disclosure may include more than one die 102. In some embodiments, the die 102 may have one or more mounts 114, which may for example, be contacts, pins, mounting pads, lands, or the like, for providing electrical connectivity to the circuit (not shown) within the die 102. The die 102 may be attached or otherwise mounted to the carrier 112 by way of the adhesive layer 110 or another suitable attachment method. The die 102 may be attached to the carrier 112 at the top surface 102a of the die 102 with the mounts 114 facing away from the carrier 112.

One or more vias 106 may be attached or otherwise created in block 1006, and as shown in FIG. 1. In one embodiment, the vias 106 may be formed within a via chip 104 which may be attached to the carrier 112 by way of the adhesive layer 110, or another suitable attachment means. In one embodiment, the via chip 104 may be placed by a pick-and-place apparatus. The via chip 104 may be comprised of one or more dielectric layers 108 and one or more vias 106 comprised of a substantially conductive material. In some embodiments, the vias 106 may be copper, or in other embodiments, the vias 106 may be aluminum, gold, palladium, silver, alloys of the same, or another conductive material. Additionally, the dielectric layers may be formed of material different than the molded substrate 202, and may separate the vias 104 from the molded substrate 202.

The via chips 104 may be formed prior to placement on the carrier 112, or vias 106 may be formed in situ on the carrier. Via chips 104, for example, may be formed as part of a larger structure. For example, multiple vias 106 or multiple via chips 104 may be formed in a single structure and then cut to a desired or predetermined size. For example, a dielectric may be etched or otherwise have via openings formed therein, and then the vias 106 may be formed by a deposition or plating process. Alternatively, the vias 106 may be milled, molded, deposited or formed with a dielectric 108 or molding compound prior to placement on the carrier 112.

Additionally, while the illustrated embodiment depicts a single die 102 with two via chips 104, one on each side of the die 102, the number and disposition of the via chips 104 and die 102 is not limited to the illustrated embodiment. For example, multiple dies 102 may be disposed on the carrier 112, with one via chip 104, or with more than two via chips 104 arranged around the dies 102.

Figure 2:
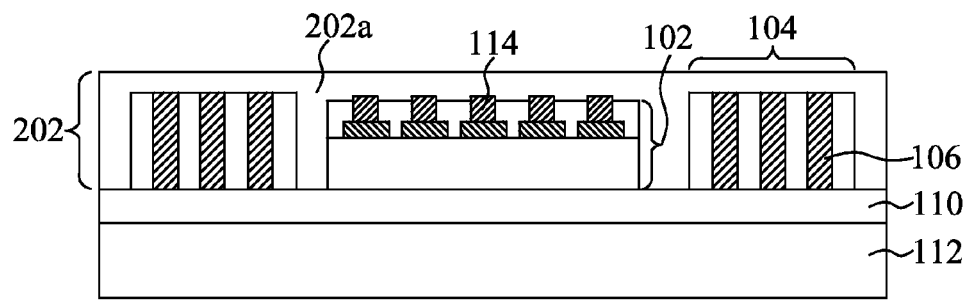

A molding compound 202a may be applied in block 1008, to form the molded substrate 202, as shown in FIG. 2. The molding compound 202a may be applied to the carrier 112, and may fill the area around the die 102 and via chip 104, and filling any gaps around the die 102 mounts 114 and vias 106. In one embodiment, the molded substrate 202 may be formed from a nonconductive material, such as an epoxy, a resin, a moldable polymer, or the like. The molding compound 202a may be applied while substantially liquid, and then may be cured through a chemical reaction, such as in an epoxy or resin. In another embodiment the molding compound 202a may be an ultraviolet (UV) or thermally cured polymer applied as a gel or malleable solid capable of being disposed around the die 102 and via chip 104. In an embodiment employing a UV or thermally cured molding compound 202a, the molded substrate 202 may be formed in place using a mold, for example, bordering the perimeter of the molded area, such as a wafer or package. Optionally, a release film may be applied prior to applying the molding compound 202a, permitting parting of a mold from the molded substrate 202, or from the carrier 112. A release film may be advantageous where the molding compound 202a is applied to the carrier 112 without an adhesive or other barrier between the molding compound 202a and carrier 112.

Figure 3:
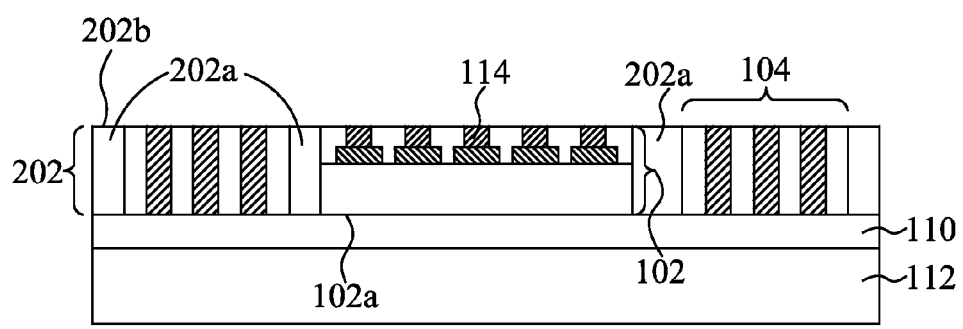

The molded substrate 202 may be reduced in block 1010, and as shown in FIG. 3. The molded substrate 202 may undergo, in some embodiments, a grinding step to remove excess material from the die 102 mounts 114 and vias 106. In such an embodiment, the molded substrate 202 may be subjected to a chemical-mechanical polish, a purely mechanical polish, chemical etching, or another suitable reduction process. The resulting reduced molded substrate 202 may, in some embodiments, have a top surface 202b at or below the top surfaces of the vias 106 and the die 102 mounts 114. In some embodiments, first ends of the vias 106 and the die 102 mounts 114 may be substantially planar with a first side 202b of the molded substrate 202. Thus, the first ends of the vias 106 and the die 102 mounts 114 may be exposed at the polished or first side 202b of the reduced molded substrate 202 so that electrical contacts may be formed on the vias 106 and die 102 mounts 114. In some embodiments, the grinding may also reduce the height of the vias 106 or die 102 mounts 114.

Figure 4:
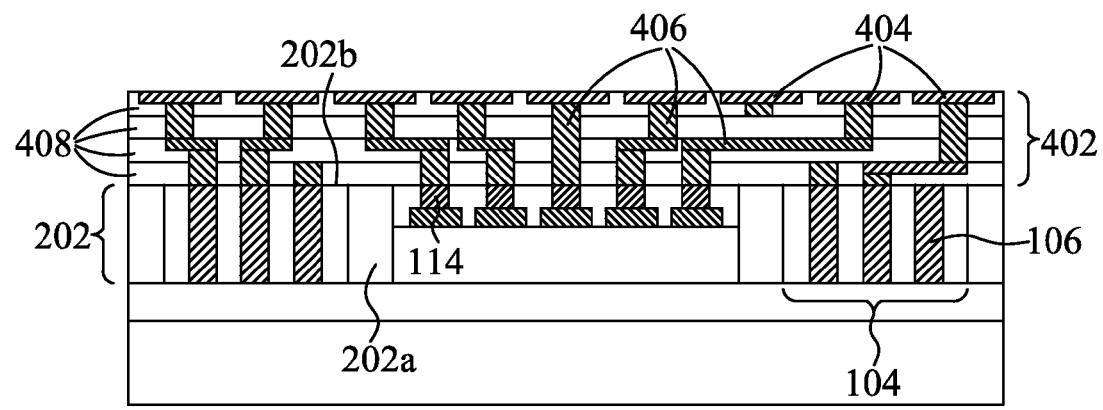

A first redistribution layer 402 (RDL) may be formed in block 1012, as shown in FIG. 4. The molded substrate 202 may have a RDL 402 disposed on one side 202b of the planarized or reduced surface. The RDL 402 may, in some embodiments, have one or more conductive lines 406 disposed in an intermetal dielectric (IMD) 408, and in electrical contact with RDL contact pads 404. The RDL 402 conductive lines 406 may further be in contact with one or more of the die 102 mounts 114 or one or more vias 106. The conductive lines 406 may fan out from one or more of the die 102 mounts 114 such that the RDL contact pads 404 may have a larger bond pitch than the die 102 mounts 114, and which may be suitable for a ball grid array or other package mounting system. In one embodiment, the RDL 402 may have conductive lines 406 configured to fan out and provide an electrical connection between the die 102 mounts 114 and RDL contact pads 404. In some embodiments, the RDL 402 may also have conductive lines 406 that connect one or more vias 106 to the RDL contact pads 404. In some embodiment, the conductive lines 406 may electrically connect, for example, a via 106 to another via 106, to a die 102 mount 114, or to another die 102 or device.

Figure 5:
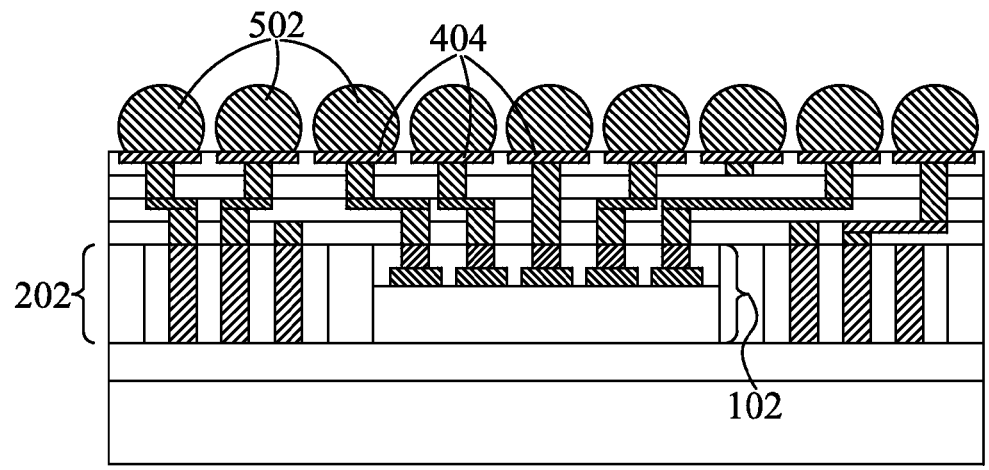

Package mounts 502 may be applied in block 1014 and as shown in FIG. 5, and the die 102 or circuit may then be tested. In one embodiment, the package mounts 502 may be applied to the RDL contact pads 404 as, for example, solder balls comprising a ball grid array. In another embodiment, the package mounts may be a land grid array (LGA), a pin array, or another suitable package attachment system.

Figure 6:
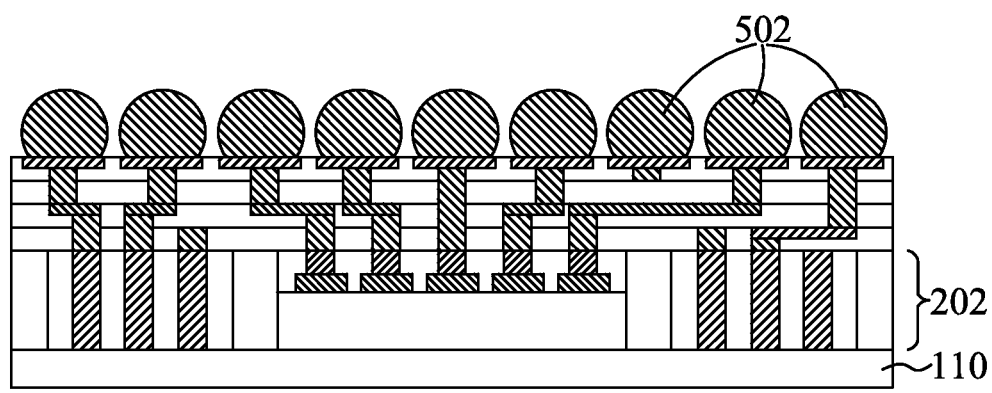

The carrier 112 may be debonded and the vias 106 exposed in block 1016. FIG. 6 illustrates a package with the carrier 112 debonded. The carrier 112 may be removed to expose the adhesive layer 110 where used, or to expose the vias and molded substrate. In one embodiment, the adhesive layer 110 may be softened or otherwise weakened through heat, ultraviolet light, or a solvent, and the carrier 112 separated from the molded substrate 202. In other embodiments, the carrier 112 may be removed through a grinding or polishing process.

Figure 7:
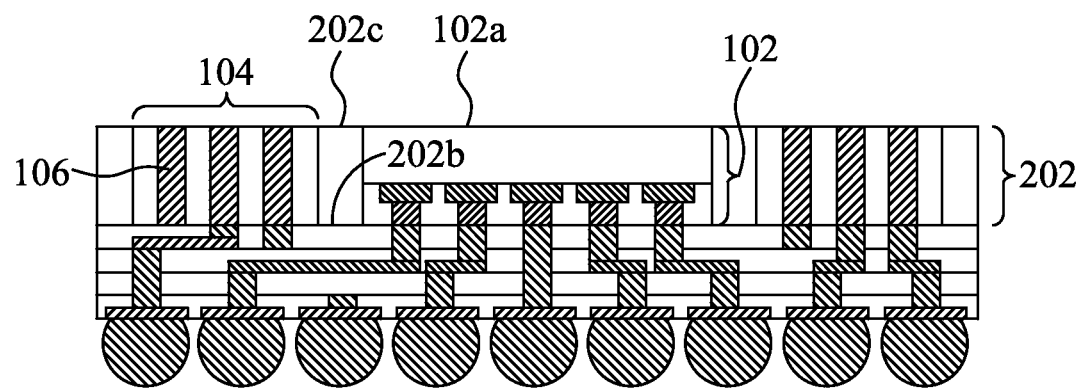

FIG. 7 illustrates a package according to an embodiment of the presented disclosure with the vias 106 exposed at the second side 202c of the molded substrate 202. The adhesive layer 110 may be removed mechanically, such as by grinding, chemical mechanical polishing, heating, or the like, or by other means, such as a solvent. In some embodiments, the adhesive layer 110 may be removed in the process of reducing or planarizing the second end of the vias 106 and second side 202c of the molded substrate 202. The adhesive layer 110 may also be removed as part of the process of removing the carrier 112. Thus, the second ends of the vias may be substantially planar with the second side 202c of the molded substrate 202. Additionally, the top surface 102a of the die 102 may be exposed through the second side of the molded substrate 202. The planarizing process applied to the second side 202c of the molded substrate 202 may also be used to bring the molded substrate 202 to a desired or predetermined thickness. For example, in one embodiment, the molded substrate 202 may be reduced to expose the top surface 102a of the die 102, resulting in a molded substrate having the about the same thickness as the height of the die 102, including the die 102 mounts 114.

Figure 8:
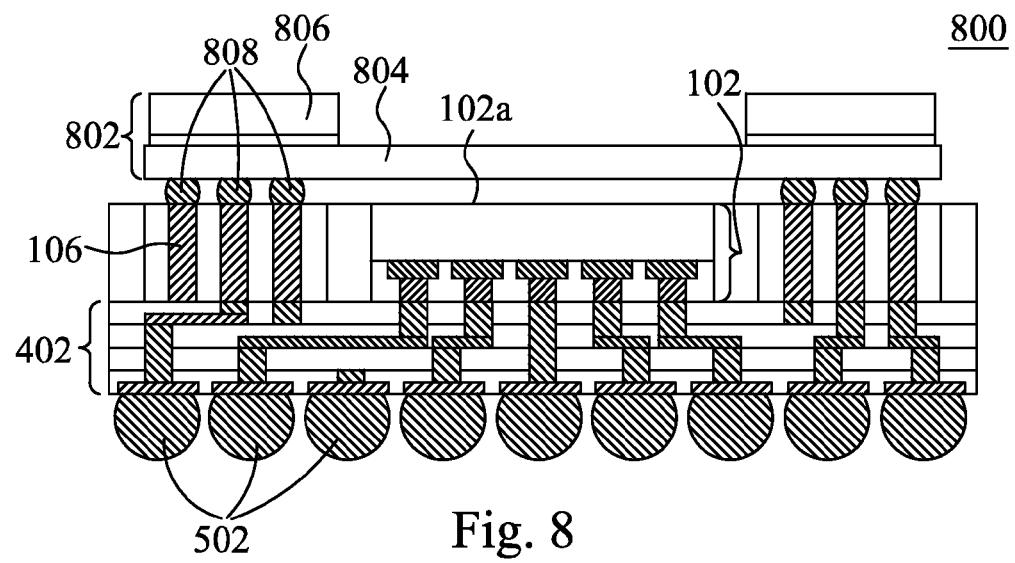
FIGS. 8-9 are cross-sectional diagrams illustrating embodiments of wafer level package structures fabricated according to embodiments of the disclosure.

A second structure 802 may be mounted in block 1018. FIG. 8 illustrates one embodiment of a fan-out wafer level package structure 800 fabricated according to the presented disclosure, with a secondary structure 802 or die mounted over a single die 102. In one embodiment, the second structure 802 may be mounted at a height where the bottom surface of the second structure 802 is separated from the top surface 102a of the die 102. In one embodiment, the second structure 802 may have a second substrate 804 and one or more structure connectors 808 may be applied to connect the second structure 802 to the vias 106. In one embodiment, the structure connectors 808 may be solder balls applied to lands on the bottom of the second structure 802. In another embodiment, the structure connectors 808 may be solder paste, a conductive adhesive, or the like.

Figure 9:
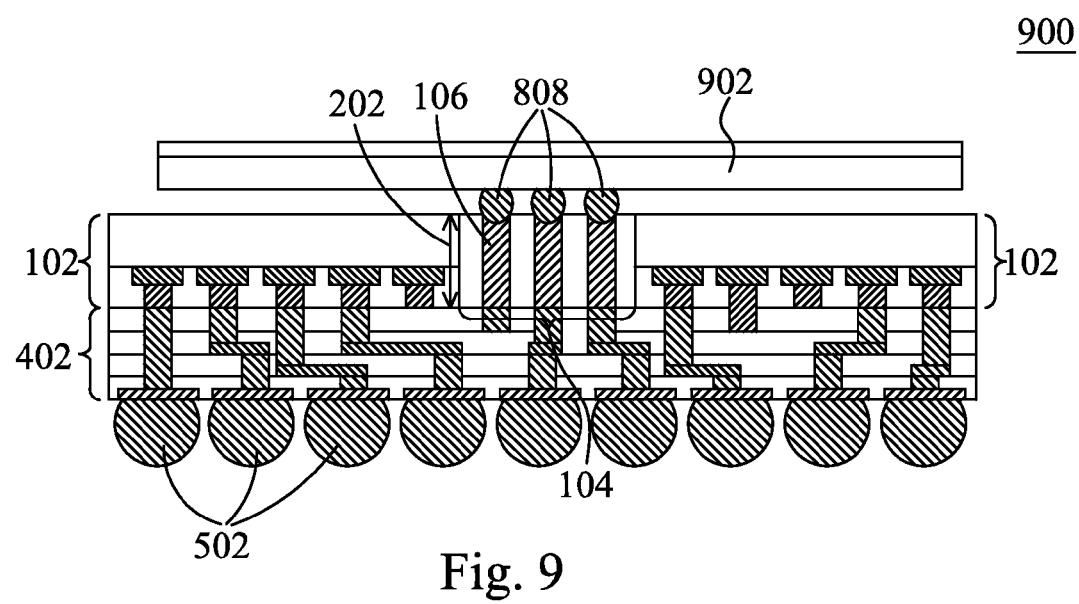

FIG. 9 illustrates another embodiment of a second fan-out wafer level package structure 900 fabricated according to the presented disclosure. A second structure 902 may, in one embodiment, be for example, a die with a pin array, such as in a wide I/O DRAM Chip. In such an embodiment, a single via chip 104 may be disposed in the molded substrate 202, with two or more dies 102 disposed at the molded substrate 202 so that the via chip 104 is disposed between at least two dies 102.

Thus, in view of the foregoing, a method for forming a fan-out wafer level package structure may comprise applying an active device or die 102 over a carrier 112, the die 102 having a plurality of mounts 114, providing one or more vias 106 on the carrier 112 and forming a molded substrate 202 over the carrier 112 and around the vias 106. The molded substrate 202 may be reduced on a first side 202b that is opposite the carrier 112 to expose vias 106. In some embodiments, mounts 114 on the die 102 may also be exposed through the first side 202b of the molded substrate 202. The ends of the vias 106 and the mounts 114 of the die 102 exposed through the first side 202b of the molded substrate 202 may be substantially planar with the first side 202b of the molded substrate 202. An adhesive layer 110 may optionally be disposed on the carrier 112, and the die and vias attached to the carrier 112 by way of the adhesive layer 110. Additionally, the molded substrate 202 may be formed on the adhesive layer 110.

Via chips 104 having vias 106, and optionally, one or more dielectric layers 108 separating the vias 106 may be used to provide the vias 106 on the carrier 112 or adhesive layer 110. The via chips 104 may be formed separate and away from the carrier 112 and adhesive layer 110 and prior to placement of the one or more via chips 104 on the adhesive layer 110. The dielectric layer 108 of the via chips 104 may separate the vias 106 from the molded substrate 202, the dielectric layer 108 comprising a material different from the molded substrate 202. In one embodiment, the molded substrate 202 may have least two via chips 104, with the die 102 disposed between the via chips 104. In another embodiment, the molded substrate 202 may have at least two dies 102 on the adhesive layer 110 and a via chip 104 disposed between the two dies 102.

An RDL 402 having a plurality of RDL contact pads 404 and conductive lines 406 may be formed on first side 202b of the molded substrate 202. The RDL contact pads 404 may have a bond pitch greater than a bond pitch of the mounts 114 of the die 102, and package mounts 502 may be disposed on the RDL contact pads 404.

The carrier 112 may be debonded and the adhesive layer 110 removed. One or more vias 106 may be exposed through the second side of the molded substrate 202 opposite the first side 202b. A second structure 802 may be mounted at the second side of the molded substrate 202, the second structure 802 having at least one die 102 disposed thereon and in electrical communication with at least one via 106. In one embodiment, a die 102 on the second structure 802 in electrical communication with at least one RDL contact pad 404 by way of at least a via 106.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, dies and vias may be attached to the carrier by any suitable means sufficient to retain the structure in place for application of the molding compound 202a. As another example, it will be readily understood by those skilled in the art that many of the steps for creating a fan-out wafer level structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method for forming a package structure, comprising:
    applying a die over a carrier, the die having a plurality of mounts with at least one exposed sidewall;
    providing one or more vias on the carrier, wherein the one or more vias is located within one or more via dies;
    after providing the vias, forming a molded substrate over the carrier and around the vias;
    reducing a first side of the molded substrate opposite the carrier and exposing the one or more vias at a first side of the molded substrate opposite the carrier, wherein the reducing the first side of the molded substrate also planarizes the plurality of mounts and the vias;
    forming a redistribution layer (RDL) on the first side of the molded substrate, the RDL having a plurality of RDL contact pads; and
    exposing the one or more vias at a second side of the molded substrate opposite the first side.

2. The method of claim 1, wherein the molded substrate comprises an adhesive layer, wherein the die is applied to the adhesive layer and wherein the molded substrate is formed on the adhesive layer.

3. The method of claim 2, wherein each of the one or more via chips has one or more vias and at least one dielectric layer disposed in the via chip to separate the one or more vias, wherein each of the one or more via chips are formed prior to applying the one or more via chips to the adhesive layer.

4. The method of claim 1, wherein the forming the RDL further comprises forming the RDL contact pads with a bond pitch greater than a bond pitch of the plurality mounts on the die.

5. The method of claim 1, further comprising mounting a second structure at the second side of the molded substrate, the second structure having at least one die disposed thereon and in electrical communication with at least one via.

6. The method of claim 1, wherein the reducing the first side of the molded substrate is performed at least in part by a chemical mechanical polishing process.

7. A method for forming a package structure, comprising:
    providing a carrier having an adhesive on a first side of the carrier;
    applying a die on the adhesive, the die having a plurality of mounts that extend away from a remainder of the die;
    providing one or more via chips on the adhesive, wherein each via chip comprises at least one via;
    after providing the vias, forming a molded substrate over the carrier and around the die and the vias;
    removing a portion of the molded substrate from over the plurality of mounts to expose the plurality of mounts, wherein after the removing the portion of the molded substrate a top surface of the molded substrate is in line with the plurality of mounts and the one or more via chips;

forming a redistribution layer (RDL) on a first side of the molded substrate, the RDL having a plurality of RDL contact pads and at least one conductive line;

applying a plurality of package mounts on the RDL contact pads; and mounting a second structure over the die and on the vias.

8. The method of claim 7, wherein the providing the one or more via chips comprises forming the one or more via chips separate and away from the carrier and adhesive layer and prior to a placement of the one or more via chips on the adhesive layer.

9. The method of claim 7, wherein the one of the one or more via chips further comprise a dielectric layer separating the vias from the molded substrate, the dielectric layer comprising a material different from the molded substrate.

10. The method of claim 7, further comprising providing at least two via chips on the adhesive, wherein the die is disposed between the at least two via chips.

11. The method of claim 7, wherein the applying the die comprises providing at least two dies on the adhesive where at least one of the one or more via chips is disposed between the at least two dies.

12. The method of claim 7, wherein the second structure comprises at least one active device and wherein the at least one active device is in electrical communication with at least one of the plurality of RDL contact pads by way of at least one of the vias.

13. A method, comprising:
providing at least one die having at least one die mount disposed at a first side, wherein the at least one die mount has at least one sidewall that is exposed;

providing at least one via disposed within a via die adjacent the die, the via die spaced apart from the die;

after providing the vias, forming a molding compound around the at least one die and the at least one via, wherein the at least one die is at least partially disposed within the molding compound, and wherein the at least one via has a first end at a first side of the molding compound and a second end at a second side of the molding compound opposite the first side, and wherein a portion of the molding compound is disposed between the at least one via and the at least one die, wherein the forming the molding compound further comprises covering the at least one die mount and then grinding the molding compound and the at least one die mount to remove an exposed portion of the at least one sidewall;

forming a redistribution layer (RDL) on the first side of the molding compound, wherein the RDL has a plurality of conductive lines disposed therein;

wherein at least one of the plurality of conductive lines are in electrical contact with the first end of the at least one via.

14. The method of claim 13, wherein the at least one die mount and the first end of the at least one via are substantially level with the first side of the molding compound.

15. The method of claim 13, wherein a second side of the at least one die is about level with the second side of the molding compound.

16. The method of claim 13, wherein the at least one die and the at least one via are disposed on a carrier before applying the molding compound.

17. The method of claim 13, wherein the providing the at least one via comprises providing a plurality of vias; and
wherein the at least one die is disposed between the plurality of vias.

18. The method of claim 13, wherein the RDL comprises a plurality of RDL contact pads having a bond pitch greater than a bond pitch of the at least one die mount, and wherein at least one of the plurality of RDL contact pads is in electrical contact with the at least one die mount through a respective one of the plurality of conductive lines in the RDL.

19. The method of claim 13, wherein the providing at least one die comprises providing two or more dies laterally adjacent to each other; and
wherein the providing at least one via comprises providing the at least one via between the at least two dies.

\* \* \* \* \*